United States Patent [19]
Schade, Jr.

[11] 4,225,816
[45] Sep. 30, 1980

[54] PRECISION CURRENT SOURCE

[75] Inventor: Otto H. Schade, Jr., North Caldwell, N.J.

[73] Assignee: RCA Corporation, New York, N.Y.

[21] Appl. No.: 41,096

[22] Filed: May 21, 1979

[51] Int. Cl.³ .............................................. G05F 3/20
[52] U.S. Cl. ......................................... 323/4; 323/23
[58] Field of Search ............... 307/296 R, 297; 323/1, 323/4, 16, 19, 23, 25; 330/288, 296, 297

[56] References Cited
U.S. PATENT DOCUMENTS

| | | | |
|---|---|---|---|
| 3,766,543 | 10/1973 | Te Winkel et al. | 340/347 DA |
| 3,982,172 | 9/1976 | van de Plassche | 323/1 |
| 4,125,803 | 11/1978 | van de Plassche | 323/1 |

Primary Examiner—A. D. Pellinen
Attorney, Agent, or Firm—E. M. Whitacre; Allen LeRoy Limberg; Allan J. Jacobson

[57] ABSTRACT

A precision binary weighted current source comprising a switching network connected to a plurality of nominally equal current sources. The switching network has $2^n$ inputs connected to $2^n$ current sources, and has $n+1$ output currents with a precise binary relation therebetween. The switching network is organized internally as a plurality of two input commutating circuits arranged in a plurality of n ranks between the input terminals and the output terminals. Output terminals are selectively connected to each current source so that the average value of each output current is proportional to the average of all of the $2^n$ input current sources.

7 Claims, 5 Drawing Figures

PRECISION CURRENT SOURCE

This invention relates to a precision current source for realizing a plurality of accurately proportioned output current levels.

A common method of converting digital numbers to analog form is to sum binary weighted currents at a summing point. Depending upon the digital number to be converted, current sources of appropriate weights are connected to the summing point. The total current at the summing point is then converted to an analog voltage with the aid of an operational amplifier. The accuracy and linearity of the conversion process depends on the accuracy of the ratio between current sources.

Te Winkel et al in U.S. Pat. No. 3,766,543 issued Oct. 16, 1973 and entitled CURRENT DIVIDER obtain binary weighted current sources using current dividers to successively divide a reference current. Conventional current mirrors have been used for apportioning applied currents equally, with precision on the order of a few percent, between their input and output circuits. A plurality of these divider circuits may be cascaded to produce binary ratioed currents by repeated division. In cascading, each current divider has a voltage drop associated with it. Divider voltage drops are cumulative so that the supply voltage required is larger than one would like. Further, digital-to-analog converters require better precision than obtainable by these methods.

One approach to providing precision ratio currents is disclosed by Van de Plassche in U.S. Pat. No. 3,982,172 issued Sept. 21, 1976 and entitled PRECISION CURRENT SOURCE ARRANGEMENT. Approximately equal currents from two input current sources are cyclically commutated to two output current terminals. Any differences between the input currents appear in each output current as a ripple component, which is then filtered with a low-pass filter. The commutation process, if accurately timed, makes the average value of each output current equal to the average value of both the input currents. Van de Plassche applies this commutation technique to the outputs of each current divider of the Te Winkel et al circuit to obtain currents in precise binary ratios. One is left, however, with the problem that the supply voltage required with cascading current dividers is higher than one would like.

Van de Plassche suggests using a pair of current mirrors to fold the output current to the opposite supply rail and back, to continue cascading divider stages. However, using conventional current mirrors for current folding introduces errors owing to their inherent departure from prescribed gain. More accurate current mirrors can be obtained by commutation of the master and slave mirroring transistors, but the structures are complex.

Van de Plassche also describes in U.S. Pat. No. 3,982,172 the generation of a plurality, n in number, of precisely matched output currents from a plurality, n in number, of nominally matched input currents. To this end he employs a commutating switch network timed by an n-phase periodic control signal, or clock, to connect the n input terminals of the switching network to its n output terminals in a cyclically permuting fashion, such that each of the output terminals is coupled to each of the input terminals within a constant cycle time during identical time intervals. Low-pass filters average ripple components that arise in the output currents due to inequalities in the levels of the input currents. Thus, n nearly equal currents are generated from n nominally equal currents.

The present inventor has discovered that, with a plural-rank commutating switch network connected to a plurality of current sources supplying nominally matched input currents, one can generate a number of output currents having average levels which differ, but are precise fractions of the total input current. This avoids the cumulative voltage drops associated with the cascading of current divider stages to generate such output currents.

Accordingly, the present invention is embodied in a plural-rank commutating switch network that commutates a plurality of nominally-matched input currents to provide output currents which have an average value being a precise fraction of the sum of the nominally matched input currents. Binary weighted currents, useful in digital-to-analog signal conversion, can be generated with this apparatus.

Figure 1:
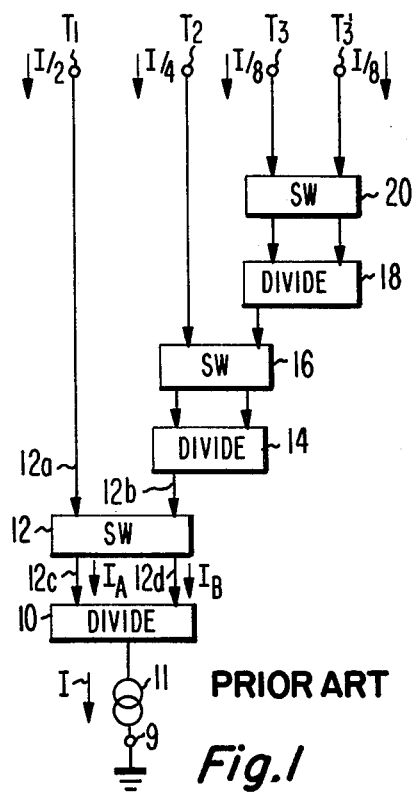
FIG. 1 is a prior art circuit for producing binary ratioed currents.

FIG. 1 shows a circuit of the general type described by Van de Plassche for producing accurate binary ratioed currents by successively dividing a reference current I. Divider 10, which may be realized by conventional current mirror techniques, divides I into two approximately equal halves: $I_A$ and $I_B$. The divider 10 output, $I_A$ and $I_B$, is input into commutating circuit 12. Commutating circuit 12 is a switching circuit, which connects its two inputs 12c, 12d, to its two outputs 12a, 12b in a first respective order during a first time interval, and in the opposite order during a second and equal time interval. By commutating inputs and outputs during equal and alternating time intervals, any difference between $I_A$ and $I_B$ is represented equally in each output current as a ripple component. While the ripple component on each output is shifted in phase, the average value of the ripple component on each output current is very nearly equal to the other. Thus, by subsequently passing each output current through a low-pass filter, nearly identical currents are obtained.

Having produced one accurate division, (I/2 at terminal T1) further binary ratio currents are produced by successive current division. Divider 14, in conjunction with commutating circuit 16, produce I/4; divider 18 and commutating circuit 20 produce I/8. Note that for proper averaging of the ripple components, each successive stage is usually switched by clock means of half the frequency of the preceding stage. Thus, if the switching frequency of commutating circuit 12 is f, then the switching frequency of commutating circuits 16 and 20 are f/2 and f/4 respectively.

Figure 4:
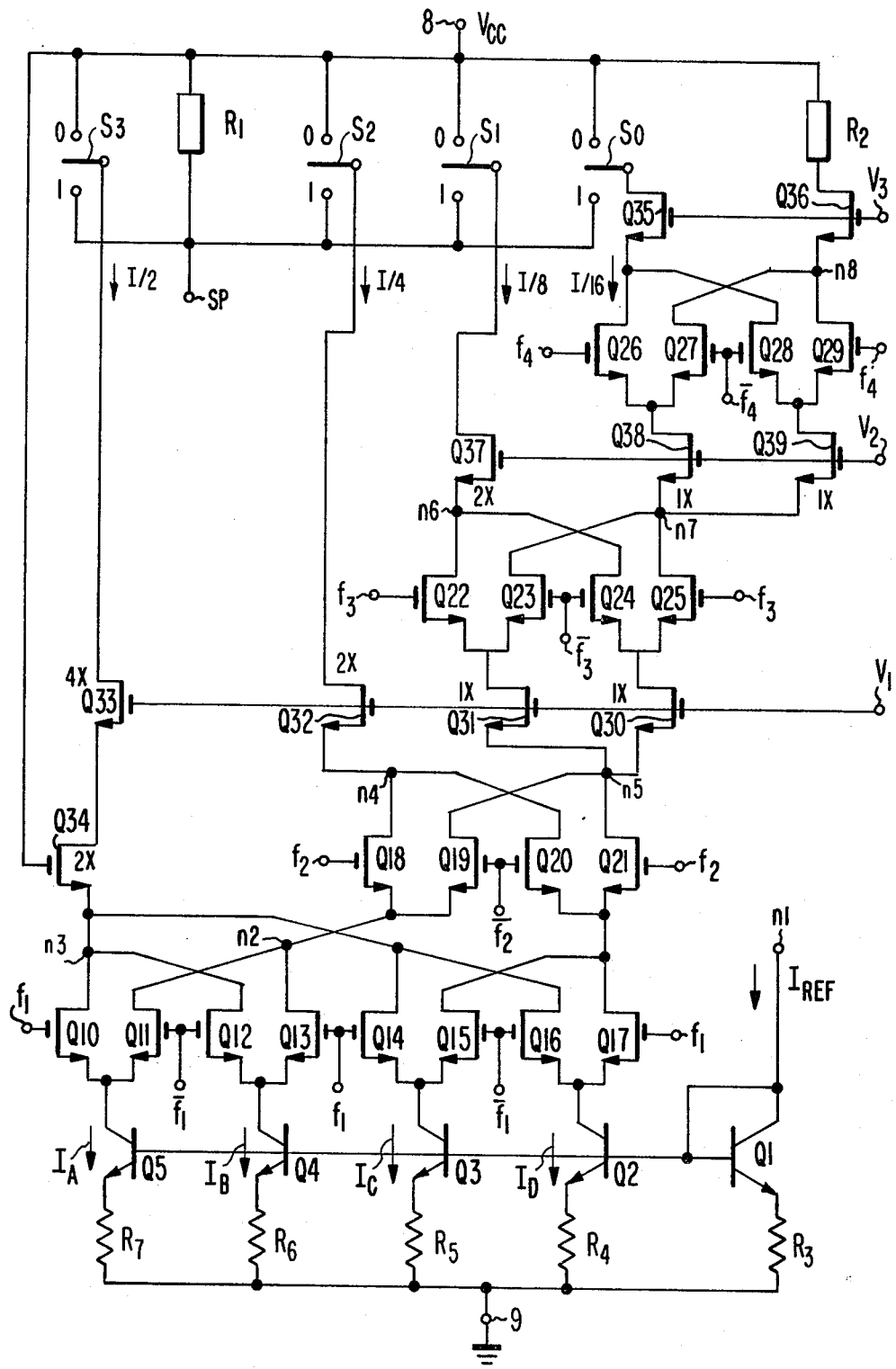
FIG. 4 is a schematic diagram of a four bit digital-to-analog converter embodying the present invention.

One embodiment of commutating circuit 12 is shown in FIG. 4, lower left. Field-effect transistors Q10, Q11, Q12 and Q13 responsive to clock signals $f_1$ and $\overline{f_1}$ selectively connect the collectors of Q5 and Q4 to nodes n2 and n3, or vice versa. In operation, clock signals $f_1$ and $\overline{f}_1$ are digital signals of sufficient magnitude to condition each respective transistor for conduction when high, and for non-conduction when low. When $f_1$ is high (and $\overline{f}_1$ is low), transistors Q10 and Q13 are conditioned to connect node n3 and n2 to Q5 and Q4 collectors respectively. Transistors Q11 and Q12 are then conditioned for non-conduction. When $f_1$ is low (and $\overline{f}_1$ high) transistors Q11 and Q12 connect node n3 and node 2 to Q4 and Q5 respectively. Thus, if $f_1$ has a fifty percent duty cycle then the outputs are connected to the inputs in commutating fashion during equal and alternating time intervals. Therefore output currents have nearly equal average values even though the input currents are unequal. To the extent that inaccuracies are present in the duty cycle of the clock, the output current match will be less than perfect. However, since the duty cycle of the clock means can be quite accurately controlled, the output current match is radically improved over the input current match.

A limitation of the cascading scheme of FIG. 1 is that as further dividing and switching stages are added in series, the voltage necessary to drive the circuit is increased. Generally, the dividers produce larger voltage drops than the switches. The circuit of FIG. 1 has six elements which must be driven in series: three switches, 12, 16, 20 and three dividers, 10, 14, 18.

Figure 2:
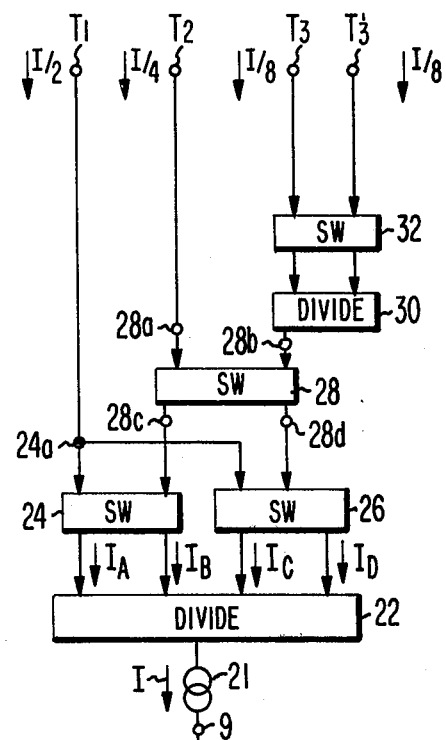
FIG. 2 is a circuit embodying the present invention for producing precise binary ratioed currents.

The circuit of FIG. 2 uses a two-rank switching network composed of three commutating circuits, 24, 26, 28 to eliminate one of these voltage drops in accordance with the present invention. Divider 22 is a representative circuit for producing four nominally, or approximately, equal currents for input to commutating circuits 24, 26 of a first rank. One output from each commutating circuit 24, 26 is connected to output terminal T1; the other output is fed to the input of commutating circuit 28.

The average value of the current at terminal T1 may be readily calculated in terms of the constant input currents $I_A$, $I_B$, $I_C$, and $I_D$. Output terminal T1 is connected to one half of the four input current sources ($I_A+I_C$) during a first time interval, and to the other half ($I_B+I_D$) during a second, and equal, time interval. Thus the average current provided to terminal T1 is $(I_A+I_C)/2+(I_B+I_D)/2$. Since I equals $I_A+I_B+I_C+I_D$, the output current average is I/2.

On the second rank, input to commutating circuit 28 is $(I_A+I_B)/2$ at terminal 28C, and $(I_C+I_D)/2$ at terminal 28D. Therefore output terminal T2 provides $(I_A+I_B)/2$ during a first time interval and $(I_C+I_D)/2$ during a second time interval. Therefore the average current provided at terminal T2 is $\frac{1}{2}(I_A+I_B)/2+\frac{1}{2}(I_C+I_D)/2$, or I/4. A conventional current divider 30 further divides I/4 to produce I/8.

Figure 3:
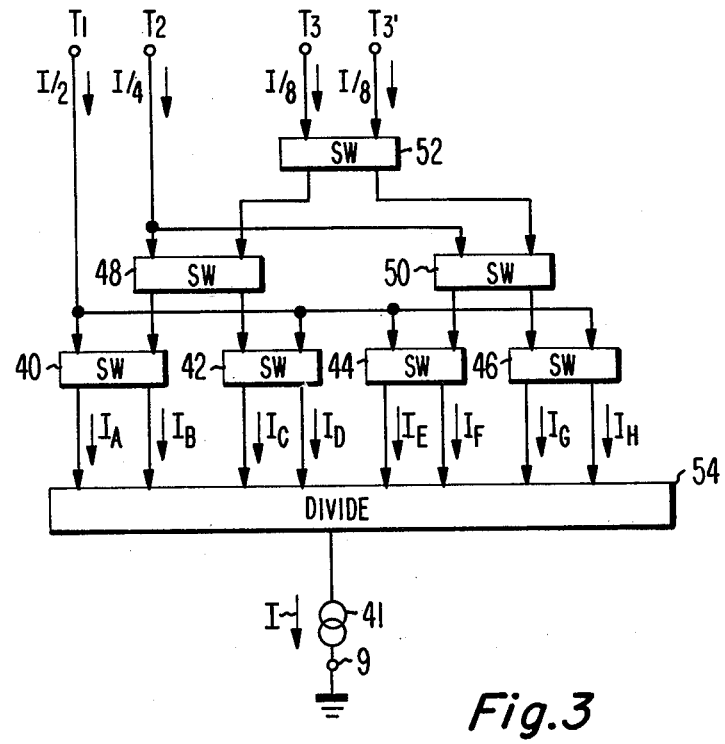
FIG. 3 is a second embodiment of the present invention used in a circuit for producing precise binary ratioed currents.

In FIG. 3, a three-rank switching network eliminates divider 30, further reducing the voltage drive requirements in accordance with the present invention. Divider 54 produces eight approximately equal currents: $I_A$, $I_B$, $I_C$, $I_D$, $I_E$, $I_F$, $I_G$, and $I_H$. The switching network, composed of the seven commutating circuits 40, 42, 44, 46, 48, 50, 52 connects terminal T1 to one half of the input current sources for one half of the time and to the other half of the input current sources during the other half of the time.

As in the two-rank network one output of each commutating circuit on the first rank is connected in common to terminal T1 and the other output is connected to an input to a commutating circuit on the second rank. Analogous to the first rank connections, one output of each commutating circuit on the second rank is connected in common to form an output terminal T2.

It can be seen that when driven by appropriate clock means, discussed hereinafter, the switching network connects T2 to one quarter of the eight input currents for one quarter of the time. For instance, during four consecutive and equal time intervals, T2 is connected to $(I_A+I_E)$, $(I_B+I_F)$, $(I_C+I_G)$, and $(I_D+I_H)$ respectively. Therefore, the average output current at T2 is $\frac{1}{4}(I_A+I_E)+\frac{1}{4}(I_B+I_F)+\frac{1}{4}(I_C+I_G)+\frac{1}{4}(I_D+I_H)$, or I/4. Similarly, terminal T3 is connected to one input current source for one eighth of the time. Therefore, the average current output at terminal T3 (and T3') is $\frac{1}{8}(I_A+I_B+I_C+I_D+I_E+I_F+I_G+I_H)$, or I/8.

Note that in all cases any difference in output current matching will contribute in equal proportions to the ripple component in each output current. To insure that each output is a true average of all inputs, the clock signals should not be the same for each rank. Otherwise, an input error will be synchronously emphasized in one output. This can be seen by considering the two-rank network of FIG. 2. If commutating circuit 28 is switched synchronously by the same clock signal, then the output current at terminal T2 will be an average of only $I_A+I_C$ (or $I_B+I_D$). For proper averaging, each rank in FIG. 2 or 3 can be switched at one half the frequency of the previous rank. Note that each rank may alternatively be switched at twice the frequency of the previous rank. Actually, if one were willing to tolerate excessively low frequency of ripple components, any differing frequencies at different switching ranks may be used. However, for ease of averaging the ripple components (which is necessary to obtain high accuracy), the highest frequency of ripple is desirable, as it is more readily filtered for its average value. One special case, which will be discussed in conjunction with the circuit of FIG. 4, is that two consecutive ranks of commutating circuits may be switched at the same frequency but shifted 90° in phase. For all cases, the clock signal always has a fifty percent duty cycle, permitting the use of simple and accurate clocking means.

In general, the switching network is a plurality of two input, two output, commutating circuits arranged in a plurality of n ordinal ranks, n being a positive integer greater than 1. Therefore there are $2^n$ input terminals and $n+1$ output terminals. Each rank contains $2^{n-m}$ commutating circuits where m is the ordinal number of the respective rank, m being equal to 1, 2, 3, ... n. The total number of commutating circuits is then $$\sum_{m=1}^{m=n} 2^{n-m}$$

It may be shown that the above summation is equal to $2^n-1$ commutating circuits in all.

The generalized switching network selectively connects each output terminal to one or more input terminals simultaneously in equal time intervals such that each output is a fixed fraction of the sum of all input sources connected to said input terminals. At any given instant, no input terminal is connected to more than one output terminal, nor is any input terminal left unconnected. Since each output current is a fixed fraction of the sum of all input currents, the ratio between average output currents is essentially independent of any mismatch between input currents.

A circuit schematic of a four bit analog-to-digital converter embodying the present invention is shown in FIG. 4. The digital input is shown schematically as four switches $S_0$, $S_1$, $S_2$, $S_3$. In practice, these switches are solid state devices responsive to four bits of digital input data. The switches connect one or more of the binary output currents I/2, I/4, I/8 or I/16 to a summing point SP depending upon the value of digital input to be converted to analog form. For example, to convert the number 1011, switches $S_3$, $S_1$, and $S_0$ connect I/2, I/8, and I/16 respectively to the summing point SP. Switch $S_2$ diverts I/4 to terminal 8 ($V_{CC}$). The analog output is the average voltage across load resistor $R_1$.

In operation, a suitable voltage supply is connected across the $V_{CC}$ terminal 8 and the common reference terminal 9. A reference current $I_{REF}$ is provided to node n1 by any suitable means, such as a resistor and a voltage source.

It will be recognized that transistor Q1 in conjunction with each of transistors Q2, Q3, Q4 and Q5 is a current mirror amplifier. That is, the transfer characteristics (collector current vs. base-emitter voltage) of Q1 is in constant proportion to the transfer characteristics of Q2, Q3, Q4, and Q5 each. Accurate tracking of transistor characteristics is achieved by fabricating transistors on a common substrate by the same manufacturing steps. Current mirror gain is then determined by the ratio of base-emitter junction areas. To provide nominally equal currents, each slave transistor Q2, Q3, Q4, and Q5 is equal in base-emitter junction area. The base-emitter junction area of Q1 may be in any convenient ratio to the area of slave transistors Q2, Q3, Q4, and Q5 so that $I_{REF}$ may be any convenient level.

Current at node n5 is further divided by conventional transistor divider means, Q30 and Q31 which have equal base-emitter junction areas. Thereafter, a commutating circuit comprising transistors Q22, Q23, Q24 and Q25 provides nearly identical currents each equal to I/8. This current is in turn divided by transistor divider Q38, Q39 and commutated by transistors Q26, Q27, Q28 and Q29 to accurately produce I/16 outputs. The divider transistors Q30, Q31, Q32, Q33, Q37, Q38, Q39, Q35 and Q36 are operated in their non-saturated analog region by proper biasing of their respective gate connections at terminals $V_1$, $V_2$ and $V_3$ respectively.

Conventional current dividers, such as current mirrors, operate best when each device therein is operated in the same region of its transfer characteristics. Under conditions of equal voltage and equal power dissipation, better current mirror operation results. Toward this end, the circuit of FIG. 4 includes compensating transistors intended to equalize the voltage across respective current sources. In particular, transistors Q32 and Q33 compensate for the voltage drop across divider Q30, Q31, so that Q2, Q3, Q4, and Q5 have the same collector voltage. Note that for proper compensation, transistor Q32 is twice as large, and transistor Q33 is four times as larger, as transistor Q30 or Q31, in terms of base-emitter junction area. Respective transfer characteristics are therefore in like proportion. Transistor Q37 similarly compensates for the voltage drop of Q38, Q39 to equalize the drain-to-source voltage of Q30 and Q31. Also, Q35 and Q36 provide equal drain-to-source voltage for Q38 and Q39.

The current I/16 through node n8 is conducted through $R_2$. If desired, this current, which represents the remaining least significant bits, may be further divided to add more bits. Alternatively, the remaining current (I/16) may be applied to a conventional R-2R resistor ladder. While the accuracy of an R-2R ladder for analog-to-digital conversion is not as great as the accurate current dividing techniques described herein, it should be noted that the highest accuracy is needed only in the most significant bits. Therefore, for an analog-to-digital converter greater than four bits, one can use the circuit shown in FIG. 4 for the most significant bits, and conventional techniques for the remaining least significant bits.

Figure 5:
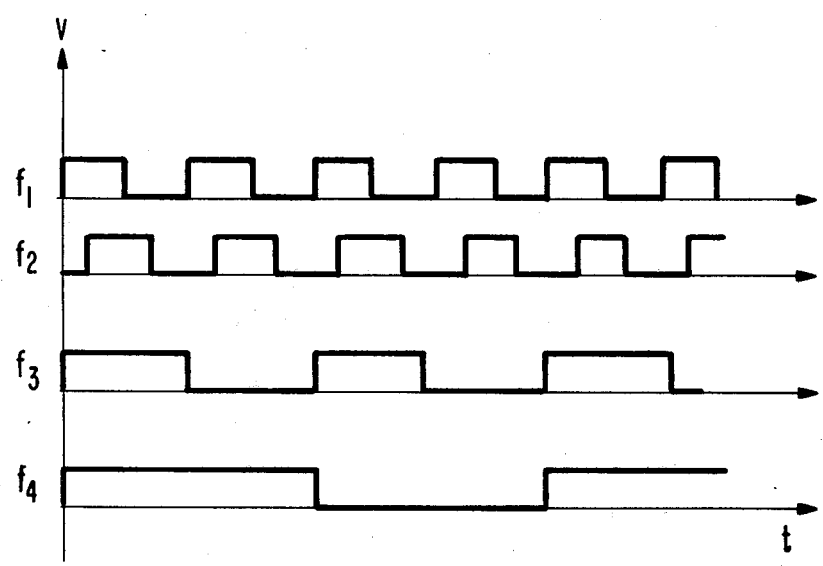
FIG. 5 is a waveform illustrating the switching signals for the circuit of FIG. 4.

FIG. 5 shows the switching signals $f_1$, $f_2$, $f_3$ and $f_4$, for the commutating circuits of FIG. 4. An inverter is necessary for each signal to provide $\overline{f_1}$, $\overline{f_2}$, $\overline{f_3}$, and $\overline{f_4}$. Waveforms $f_4$ and $f_3$ are half the frequency of $f_3$ and $f_2$ respectively so that each commutating circuit sees a complete cycle (a sample of each of the two previous input current sources) before switching to the other half of its own input divider circuit. On the other hand, $f_2$ is the same frequency as $f_1$ but 90° out of phase. It can be seen that due to the phase shift, the second rank commutating circuit will see at node 4 a sample of $I_A$ and $I_B$ when $f_2$ is high, and a sample of $I_C$ and $I_D$ when $f_2$ is low. However, such technique can only be used in two ranks of a switching network.

Of particular concern is the total voltage required to drive the series connected circuit of FIG. 4. The voltage drop associated with the first current source (the four-way divider) is about 1 volt. The two-rank switching network requires about 0.12 volts. The next divider Q30, Q31 absorbs about 0.4 volts. The remaining two switch drops are about 0.02 volts each, and the remaining divider Q38, Q39, absorbs about 0.2 volts. Therefore, the entire series voltage drive required for I/16 is 1.8 volts. With $V_{CC}$ nominally at 5 volts, there is ample voltage available to drive output load R1. Accurate operation has been achieved using the circuit of FIG. 4 at power supply voltage as low as 4 volts.

It will be recognized that a switching network, in accordance with the present invention, may be used to achieve output current ratios other than binary. Several output currents may be summed together, or the commutating circuit outputs on each rank may be summed differently. Furthermore, it is not necessary that all outputs be used as a component of the desired output currents in achieving different output current ratios.

What is claimed is :

1. A precision current source comprising:
    a plurality of n+1 output terminals consecutively ordinally numbered from 1 to n+1, where n is a positive integer greater than 1;
    $2^n$ input terminals, suitable for receiving $2^n$ sources of nominally equal currents;
    a plurality, $2^n-1$ in number, commutating circuits each having respective first and second input electrodes, first and second output electrodes, a respective control terminal, each of said commutating circuits responsive to a first phase of clock signal applied to its respective control terminal to selectively connect its first input electrode to its first output electrode and to selectively connect its second input electrode to its second output electrode, each of said commutating circuits responsive to a second phase of clock signal applied to its respective control terminal to selectively connect its first input electrode to its second output electrode and to selectively connect its second input electrode to first output electrode;

said $2^n-1$ commutating circuits being arranged in a plurality of n consecutively ordinally numbered ranks, each rank containing $2^{n-m}$ commutating circuits where m is the ordinal number of the rank consecutively ranging from m=1 to m=n, the input electrodes of the commutating circuits of the first rank being connected to respective ones of said $2^n$ sources of nominally equal currents;

the first output electrodes of each rank being connected to the output terminal of the same ordinal numbering as that rank, the second output electrodes of each rank, except for the nth rank, being connected to the separate respective ones of the first and second input electrodes of the rank with the next higher ordinal number, the second output electrode of the commutating circuit of nth rank being connected to the n+1 output terminal;

means for providing n differing clock signals consecutively ordinally numbered from 1 to n, each of said clock signals providing said first phase of clock signal and said second phase of clock signal during equal and alternating time intervals; and means for applying each of said n differing clock signals to the control terminals of the commutating circuits in the rank of the same ordinal numbering as its respective clock signal.

2. A switching network according to claim 1 wherein at least one respective output terminal of ordinal number less than n is connected in series with a respective compensating transistor, said compensating transistor connected to conduct current through its principal current conduction path to said respective output terminal, the control electrode of said compensating transistor being biased to condition same for conduction.

3. A current source for providing accurately binary ratioed average currents comprising:
four nominally equal current sources;
first and second output terminals;
first, second, and third commutating circuits wherein each commutating circuit has respective first and second input electrodes, respective first and second output electrodes, and a respective control terminal;
said first and second commutating circuits being connected at their first and second input electrodes respectively to each of said four current sources;
said third commutating circuit connected at its respective first and second input electrodes to the respective second electrodes of said first and second commutating circuits;
a first output node to which the first electrodes of said first and second commutating circuits are connected;
a second output node to which the first electrode of the third commutating circuit is connected;
means for connecting the first output terminal to said first output node;
means for connecting the second output terminal to said second output node;
first clock means connected to the respective control terminals of said first and second commutating circuits for conditioning each of them to selectively connect its first input electrode to its first output electrode and its second input electrode to its second output electrode during a first time interval and to selectively connect its first input electrode to its second output electrode and its second input electrode to its first output electrode during a second time interval, wherein said first and second time intervals are equal and alternating time intervals; and second clock means, differing from said first clock means, connected to the control terminal of said third commutating circuit for conditioning same to selectively connect its first input electrode to its first output electrode and its second input electrode to its second output electrode during a third time interval, and to selectively connect its first input electrode to its second output electrode and its second input electrode to its first output electrode during a fourth time interval, wherein said third and fourth time intervals are equal and alternating time intervals.

4. A current source according to claim 3 wherein the means connecting said first output terminal to said first output mode comprises a direct connection without substantial intervening impedance.

5. A current source according to claim 3 wherein the means connecting said second output terminal to said second output node comprises a direct connection without substantial intervening impedance.

6. A current source according to claim 3 wherein said first, second, and third commutating circuits each comprise:
first, second, third, and fourth transistors having respective first and second electrodes defining the ends of a principal current conduction path, and having respective third electrode, the potential on said respective third electrode controlling the conduction of its respective principal current conduction path;
the first electrodes of the first and second transistors being connected to a respective first input electrode;
the first electrodes of the third and fourth transistors being connected to a respective second input electrode;
the second electrodes of the first and third transistors being connected to a respective first output electrode;
the second electrodes of the second and fourth transistors being connected to a respective second output electrode;
the third electrodes of the second and third electrodes being connected to a respective first control terminal;
the third electrodes of the first and fourth electrodes being connected to a respective second control terminal; and
wherein the means connecting the first output terminal to the first output node is a first compensating transistor connected to conduct current through its principal current conduction path in series between the first output terminal and the first output node, the control electrode of said first compensating transistor being biased to condition same for conduction.

7. A current source according to claim 6 further comprising:
third and fourth output terminals;
fifth, sixth, seventh and eighth transistors having respective first and second electrodes defining the ends of a principal current conduction path, and having respective third electrode, the potential on said respective third electrode controlling the conduction of its respective principal current conduction path;

said fifth and sixth transistors having substantially equal second electrode current to third electrode voltage characteristics; said seventh transistor having substantially twice the second electrode current to third electrode voltage characteristics as said fifth transistor, said eighth transistor having substantially four times the second electrode current to third electrode voltage characteristics as said fifth transistor;

said fifth transistor connected to conduct current through its principal current conduction path from said second electrode of said third commutating circuit to said fourth output terminal;

said sixth transistor connected to conduct current through its principal current conduction path from said second electrode of said third commutating circuit to said third output terminal;

wherein said means for connecting the second output terminal to the second output node comprises the principal current conduction path of said seventh transistor in series therebetween;

wherein said means for connecting the first output terminal to said first output node further comprises the principal current conduction path of said eighth transistor in series with said first compensating transistor; and a source of bias voltage to which the control electrodes of said fifth, sixth, seventh, and eighth transistor are connected;

said bias voltage source being of a value to condition said respective transistors to conduct current substantially in proportion to their respective relative second electrode current to third electrode voltage characteristics.

* * * * *